(12) United States Patent
Koeppendoerfer et al.

(10) Patent No.: US 10,942,208 B2
(45) Date of Patent: Mar. 9, 2021

(54) MONITORING SYSTEM, SAFETY CABLE AND TUBE FOR SUCH A SYSTEM, AND METHOD FOR OPERATING A MONITORING SYSTEM

(71) Applicant: LEONI KABEL GMBH, Nuremberg (DE)

(72) Inventors: Erwin Koeppendoerfer, Schwabach (DE); Johannes Nachtrab, Windsbach (DE)

(73) Assignee: LEONI Kabel GmbH, Nuremberg (DE)

( * ) Notice: Subject to any disclaimer, the term of this patent is extended or adjusted under 35 U.S.C. 154(b) by 472 days.

(21) Appl. No.: 15/907,510

(22) Filed: Feb. 28, 2018

(65) Prior Publication Data

US 2018/0188310 A1      Jul. 5, 2018

Related U.S. Application Data

(63) Continuation of application No. PCT/EP2016/069839, filed on Aug. 22, 2016.

(30) Foreign Application Priority Data

Aug. 28, 2015 (DE) ..................... 10 2015 216 474.8

(51) Int. Cl.
*G01R 31/08* (2020.01)
*G01R 27/26* (2006.01)
(Continued)

(52) U.S. Cl.
CPC ........ *G01R 31/083* (2013.01); *B60R 16/0231* (2013.01); *G01R 27/26* (2013.01);
(Continued)

(58) Field of Classification Search
CPC ..... G01R 31/08; G01R 31/081; G01R 31/083
See application file for complete search history.

(56) References Cited

U.S. PATENT DOCUMENTS 5,463,317 A    10/1995 Murphy
2009/0284264 A1    11/2009 Ng
(Continued)

FOREIGN PATENT DOCUMENTS

DE      10203163 A1    8/2003
EP      0767918 B1    11/2001
(Continued)

*Primary Examiner* — Walter L Lindsay, Jr.
*Assistant Examiner* — Milton Gonzalez
(74) *Attorney, Agent, or Firm* — Laurence A. Greenberg; Werner H. Sterner; Ralph E. Locher

(57) ABSTRACT

A monitoring system contains a safety cable that has at least one line along which a fault sensor device extends. The safety cable has a capacitor with two electrodes and an inductor which is made of a conductor that is electrically connected to one of the electrodes such that a series resonant circuit is formed. By ascertaining a resonant frequency of the series resonant circuit, the state of the safety cable, in particular the wear of the safety cable, is determined and a possible future fault is predicted in particular. A corresponding safety cable in particular in the form of a prefabricated material available by the meter and a method for operating the monitoring system are described.

21 Claims, 2 Drawing Sheets

(51) Int. Cl.
    *H04B 3/46*     (2015.01)
    *G01R 31/58*    (2020.01)
    *B60R 16/023*   (2006.01)
    *G01R 31/00*    (2006.01)

(52) U.S. Cl.
    CPC ....... *G01R 27/2664* (2013.01); *G01R 31/007* (2013.01); *G01R 31/58* (2020.01); *H04B 3/46* (2013.01)

(56) References Cited

U.S. PATENT DOCUMENTS

2014/0347070 A1\* 11/2014 Scheuschner .......... G01R 31/08
                                                    324/543
2017/0292981 A1\* 10/2017 Reitsma ................. G01R 27/32

FOREIGN PATENT DOCUMENTS

| GB | 2123567 A | | 2/1984 |
| GB | 2317707 A | | 4/1998 |
| JP | S5180978 A | | 7/1976 |
| JP | S5222998 A | | 2/1977 |
| JP | H0318725 A | | 1/1991 |
| JP | H04320977 A | | 11/1992 |
| JP | 06148123 A | \* | 5/1994 |
| JP | H10502173 A | | 2/1998 |
| JP | 2011059070 A | | 3/2011 |
| JP | 2011145254 A | | 7/2011 |
| JP | 2015025733 A | | 2/2015 |

\* cited by examiner

MONITORING SYSTEM, SAFETY CABLE
AND TUBE FOR SUCH A SYSTEM, AND
METHOD FOR OPERATING A
MONITORING SYSTEM

CROSS-REFERENCE TO RELATED
APPLICATION

This application is a continuation, under 35 U.S.C. § 120, of copending international application No. PCT/EP2016/069839, filed Aug. 22, 2016, which designated the United States; this application also claims the priority, under 35 U.S.C. § 119, of German patent application No. DE 10 2015 216 474.8, filed Aug. 28, 2015; the prior applications are herewith incorporated by reference in their entirety.

BACKGROUND OF THE INVENTION

Field of the Invention

The invention relates to a monitoring system, a safety cable and a tube for such a monitoring system and a method for operating such a monitoring system.

Cables, in particular data cables, are regularly used to control safety-relevant systems in which a malfunction in the cable and consequently in the system that is dependent on the cable may lead to consequential damages that are sometimes of a serious nature. Drive assist systems for vehicles in particular are at risk of a malfunctioning cable resulting in a corresponding malfunction of the drive assist system. Hitherto, drive assist systems, such as by way of example autopilots or park assist systems, have been used predominantly to promote the comfort function and in parallel to a manual control of a vehicle with the result that in the event of a malfunction of the drive assist system the driver maintains or assumes the control of the vehicle. However, it is desirable in the context of the so-called autonomous driving to forego driver participation to the greatest possible extent. Since it is to be no longer necessary for the driver to intervene and it is also no longer possible for the driver to actively monitor the vehicle, it is particularly relevant for a drive assist system that is used for autonomous driving and not merely as a comfort function to be safeguarded against failure.

SUMMARY OF THE INVENTION

It follows from this that the object of the invention is to provide a monitoring system that is as reliable as possible and that contains as a cable a safety cable or alternatively a tube whose malfunction can be detected in a reliable as possible manner. In particular, any possible malfunction is to be determined in good time or to be forecast. Furthermore, a safety cable and a tube for the monitoring system are to be provided and also a method for operating the monitoring system.

The monitoring system contains a safety cable that comprises at least one line and a malfunction sensor system extends along the line. The malfunction sensor system has a capacitor, which comprises two electrodes, and an inductor that is formed by a conductor that is electrically connected in particular at the end face to one of the electrodes in such a manner that a series resonant circuit is formed. The capacitor and the two electrodes extend in particular continuously and without interruption over the entire length of the line.

A particular advantage of the invention resides in particular in the fact that it is possible by the series resonant circuit that is integrated into the safety cable to determine a change of state and in particular to detect damage to the safety cable. The monitoring system consequently contains a cable and it is possible to monitor the functionality of the cable by means of the electronic malfunction sensor system. This electronic malfunction sensor system is significantly formed by means of the series resonant circuit which can be used to measure changes in the safety cable and as a result also in the line. This is based on the consideration that the series resonant circuit of the safety cable contains a specific resonance frequency that changes if it is impaired or damaged. To be more precise, the capacitor contains a capacitance value and the inductor contains an inductor value that significantly determine the resonance frequency and are dependent upon the geometry and also upon the material characteristic of the safety cable, in particular of the malfunction sensor system. In particular, the resonance frequency is conversely proportional to the quadratic root of the product of the capacitance value and the inductor value. By way of example, in the event of an expansion of the safety cable, the surface area of the electrodes changes accordingly, whereas the inductor is not influenced and the resonance frequency changes accordingly. Any damage to the electrodes or the conductor usually has a corresponding effect on the resonance frequency with the result that it is also possible in this manner to detect any impairment of the safety cable. The electrodes and/or the conductor are expediently configured in such a manner that when the safety cable is by way of example subjected to regular mechanical loading the electrodes and/or the conductor become damaged before the line becomes damaged and a warning signal can be emitted and also suitably displayed in good time prior to the malfunction of the line.

The malfunction sensor system is used primarily to monitor the line that is in particular a conventional line and contains one or a multiplicity of cores and/or core pairs. Since the malfunction sensor system extends in particular along the entire line, it is also ensured that the entire line is monitored accordingly. A safety cable having a multiplicity of lines is fundamentally also conceivable. It is preferred that the malfunction sensor system is in addition integrated in a sheath or outer sheath of the safety cable.

The malfunction sensor system is in particular not part of the internal structure of the safety cable, in other words it is separate from the so-called useable structure. In other words: the malfunction sensor system is not integrated in an internal structure of the safety cable but rather is arranged outside the internal structure. The term 'internal structure' is understood to mean in particular the at least one line and where appropriate an entirety of lines and/or cores, in particular a cable core of the safety cable. If a detection element, by way of example a wear-indicating core, is integrated in the internal structure, there is fundamentally the risk that in the event of this detection element becoming damaged, the internal structure also becomes damaged or is negatively influenced. This is however advantageously prevented by virtue of the malfunction sensor system being configured separately.

The monitoring system in accordance with the invention is also fundamentally conceivable in an alternative embodiment with a tube in lieu of a safety cable having a line. The monitoring system contains in that case a tube and a malfunction sensor system extends along the tube, the malfunction sensor system having a capacitor, which contains two electrodes, and an inductor that is formed by a conductor that is electrically connected in particular at the end face to one of the electrodes in such a manner that a series resonant circuit is formed. The capacitor and the two electrodes extend in particular in a continuous and uninterrupted manner over the entire length of the tube. This embodiment option is available in particular as a result of the malfunction sensor system being separate from the internal structure of the tube or cable, in other words in general being a strand product that is to be monitored. Thus, in other words, in the case of the monitoring system in one variant, a tube is used in lieu of a safety cable having one or a multiplicity of lines and/or cores. Such a tube is used by way of example for guiding a medium, for example a gas or a liquid, and alternatively or in addition thereto for housing a number of lines and/or cores. Quite generally, a strand product is used in the monitoring system in one variant of the invention, wherein the malfunction sensor system extends along the strand product. The strand product in that case is by way of example a tube or a cable. Advantageous embodiments and variants and also their advantages are realized in a similar manner to the embodiments and variants described below in conjunction with a safety cable as a strand product.

In one preferred embodiment, the conductor is arranged between the electrodes, as a result of which the conductor is shielded in particular both against the environment of the safety cable and also with respect to the line. As a consequence, it is ensured that the resonance frequency is determined in a particularly reliable manner.

When a safety cable has a given length between two ends, the electrodes and the conductor also extend between these two ends and form at the end face in each case in particular contacts. In order to form the series resonant circuit, during the course of assembling the safety cable, one of the electrodes is electrically connected to the conductor and in fact preferably at the end face so as to form the series resonant circuit over the entire length. As a consequence, a two-pole connection is formed at the other end, namely in particular by the other end of the conductor and by one end of the other electrode, wherein the series resonant circuit, in other words the malfunction sensor system, may be connected via the two-pole connection to an analysis unit so as to measure the resonance frequency.

The safety cable is preferably a data cable, in other words the line is formed as a data line for transmitting data and contains for this purpose by way of example a multiplicity of core pairs. A data cable is regularly used for control purposes and/or for transmitting data between a control or monitoring unit and a system that is connected thereto via the data cable, by way of example a drive assist system or a vehicle component. The safety cable of the monitoring system is suitable in particular as a data cable in safety-relevant systems, in other words in particular in such systems where a malfunction of the connection is not immediately picked up by a manual intervention and may result in material damage and/or personal injury. This is particularly the case in systems for autonomously controlling a vehicle, by way of example in the case of a camera for an autopilot. The monitoring system is therefore suitably installed in an onboard electrical system of a vehicle, wherein a drive assist system of the vehicle is connected to the onboard electrical system by means of the safety cable. The line connects the drive assist system to an onboard electrical system of the vehicle, by way of example to a control unit of the vehicle.

The monitoring system is advantageously not used or not only used to ascertain an actual malfunction of the line but rather on the contrary it is used to provide the prognosis of a future malfunction. In this context, an aging or wear characteristic of the line, in particular of the entire safety cable, is important. This wear characteristic depends in principle on the specific use and loading of the line, with the result that initially it is usually only possible to provide an imprecise prognosis regarding the serviceable life based on general empirical values, in other words statements regarding the serviceable life of the line, However, it is possible using the monitoring system to monitor the wear process of the line from time to time and to adjust the serviceable life prognosis on the basis of the ascertained change in the resonance frequency. For this purpose, expedient calibration measurements are initially ascertained for lines that have been subjected to different loadings or have aged differently, the measurements being used as a basis for a comparison with the resonance frequency that is ascertained during each monitoring procedure. As a consequence, it is possible in an advantageous manner to determine the wear of a specific line directly and in fact in particular independently of general considerations that are primarily based on the utilization time of the line and individual loadings during the utilization period are typically ignored.

In one suitable embodiment, the monitoring system contains an analysis unit having a printed circuit board and the malfunction sensor system is connected to the printed circuit board. By way of example, the malfunction sensor system is soldered via the connection of the series resonant circuit to suitable contact surfaces on the printed circuit board. In an alternative, likewise suitable, embodiment, the safety cable comprises a plug-type connector by which the malfunction sensor system may be connected to an in particular external analysis unit, in other words an analysis unit that is not part of the monitoring system. In that case, the analysis unit is by way of example a part of a control unit of a vehicle or in particular placed as a separate part of the monitoring system at a suitable site. Alternatively, it is also conceivable to integrate the analysis unit in the safety cable. In one variant, the analysis unit is an external device that is connected to the safety cable merely so as to ascertain the resonance frequency and is otherwise separate from the safety cable. The connection is expediently configured as a service connection for the safety cable so as to connect it to the analysis unit by way of example during a maintenance procedure.

It is therefore preferred that the monitoring system is an at least in part assembled safety cable that has a length of by way of example a few 10 cm up to a few meters as desired for the intended use, especially for use in the motor vehicle. The one electrode is connected in a conductive manner to the inductor.

In further assembly steps, the assembled safety cable contains a plug-type connector having the in particular a two-pole connection and an integrated analysis unit that is integrated by way of example on a printed circuit board. In the case of the integrated analysis unit, it is preferred that the assembled safety cable contains furthermore signal connections, by way of example plug-type connections, a plug-type connector for transmitting output signals to the analysis unit.

It is therefore only necessary to connect a pre-assembled safety cable of this type, for example via plug-type connectors, in particular to an onboard electrical system of a motor vehicle.

The analysis unit is used in particular to measure the resonance frequency of the series resonant circuit and expediently also to ascertain a change or deviation from a normal frequency. It is therefore preferred that when the monitoring system is being operated a resonance frequency of the malfunction sensor system is initially ascertained, by way of example in that a signal having a broadband frequency spectrum is applied to the series resonant circuit so as to generate a response spectrum in which the resonance frequency is ascertained as a frequency having a maximum amplitude. The ascertained resonance frequency is subsequently compared with a predetermined normal frequency that would be determined by way of example by means of a previous calibration measurement and stored as a reference in a storage device. In the event that the resonance frequency deviates by a predetermined minimum value, a corresponding signal is output. This signal is by way of example a warning sound or an indicating lamp is illuminated.

The conductor of the malfunction sensor system is preferably configured as a wire that is wound up—or spun—in a multiplicity of windings around the line. As a consequence, the inductor is configured in a particularly simple and space-saving manner as a coil. In particular, the conductor forms a so-called D-shield of the safety cable. In a first, particularly simple embodiment, the wire is spun around the conductor in such a manner that the windings are in contact with one another. Despite a possible electrical short circuit, the contact resistance between adjacent windings is usually of sufficient magnitude so as to continue to conduct a current that is applied to the inductor in a helical manner through the windings and to realize an inductor.

In one advantageous variant, the windings are spaced apart from one another in the longitudinal direction so as to adjust a specific inductance value of the inductor. The inductance value is expediently adjusted across the spacing of the windings, in other words in particular in such a manner that in cooperation with the capacitance value a resonance frequency is realized that is to be measured in a simple manner as possible, preferably a resonance frequency in the range of a few 10 kilohertz up to a few megahertz.

As an alternative or in addition thereto, the conductor is advantageously an insulated wire, in particular an enameled wire, as a result of which in particular a short circuit of the windings amongst one another is avoided in a simple manner. In addition, an insulated wire is automatically electrically insulated with respect to the electrodes with the result that also in this case a short circuit is prevented in an efficient manner.

In one advantageous embodiment, at least one electrode and preferably two electrodes is/are configured in each case as a shielding layer and completely enclose the line. The electrodes thus fulfill an advantageous dual function in that on the one hand they are electrodes of the capacitor, on the other hand however they also shield the line against electrical signals from the environment and conversely. If the line is already a shielded line, then its conventional shielding is expediently not provided or this conventional shielding is used as an electrode with the result that the safety cable is configured in particular in a particularly compact manner.

In a suitable manner, the two electrodes are arranged in a concentric manner and form in this manner a cylinder capacitor having an inner and an outer electrode. In other words: the two electrodes are configured with a circular cross-section having the same middle point. The line is enclosed in particular by two electrodes and therefore extends in the interior of the inner electrode. Such an embodiment contains in particular the advantage that the line of the safety cable is not influenced by the electrical field between the electrodes. As a consequence, cross-talk in the line particularly when the resonance frequency is being measured is prevented and as a consequence any possible impairment of a system that is connected to the line is also prevented. Simultaneously, conversely the capacitance value of the capacitor advantageously remains unaffected by the line.

In one expedient variant, so as to galvanically isolate the conductor from the electrodes, an intermediate layer of an insulating material is arranged, in particular surface-extruded, between the conductor and one or respectively one of the electrodes. The conductor is accordingly galvanically isolated with respect to the respective electrode insofar as the electrode and the conductor are not electrically connected along the safety cable but rather merely at the end face in the case of the configuration of a series resonant circuit. The conductor is spatially spaced apart from the electrode in particular by the intermediate layer or as an alternative is embedded in the intermediate layer.

All current synthetic materials in particular PU, PVC, PE or similar materials are suitable as an insulating material. The advantage of a surface-extruded intermediate layer resides in particular in the fact that said intermediate layer is continuous and thus particularly robust and media-tight. As an alternative, however, a banding or winding arrangement is also suitable for providing the electrical insulation. In the case of a conductor that is arranged between the electrodes, the conductor is expediently enclosed by two intermediate layers or in one variant is embedded in a common intermediate layer.

In one suitable embodiment, one of the electrodes is configured as a braid of a conductive material, in other words in particular as a so-called C-shield. Such a braid is particularly robust in the mechanical aspect and represents in addition an advantageous reinforcement of the safety cable. The braid is by way of example manufactured from steel wires or tin-plated copper wires. In a particularly suitable variant, the outer electrode of the capacitor is configured as a braid so as accordingly to provide optimal protection for all inner-lying parts, in particular also for the conductor and the inner electrode.

In a particularly compact design, one of the electrodes is a conductive layer of a multi-layer foil that contains an insulating carrier layer and the conductive layer is applied to the carrier layer. The electrode is consequently in particular configured as part of a foil shield that is also described as a B-shield. In a preferred manner, the foil is a metal-laminated foil that is particularly thin and as a consequence produces a particularly compact construction of the safety cable. In the case of the embodiment having a multi-layer foil, there is the added advantage that the conductive layer as a thin metal layer is usually more brittle than the line with the result that a heavy mechanical loading initially causes damage to the corresponding electrode and changes the resonance frequency. It is concluded from this that the line is being correspondingly loaded and the remaining serviceable life of said line is ascertained, by way of example on the basis of previous test series that in an empirical manner associate the brittleness of the conductive layer with the remaining serviceable life of the line in an empirical manner.

Advantageously, in a further development so as to form an intermediate layer for providing the galvanic isolation, the carrier layer faces the conductor and the carrier layer is arranged between the conductor and the conductive layer.

Overall, it is preferred that the electrodes and the conductor form a three-part concentric arrangement. The electrodes and the conductor not only form elements of the malfunction sensor system but rather simultaneously in particular also form in each case a shielding layer. By virtue of this advantageous dual function, the line is also particularly efficiently shielded against external influences. The electrodes are configured in a particularly simple embodiment in each case as a B-shield or C-shield and the conductor is configured as a D-shield. A construction is particularly preferred that overall when viewed outward from the inside produces a B/D/C- or B/D/B-shield. Such arrangements are particularly simple to produce.

In one variant, two electrodes are configured as conductive layers of a multi-layer foil, wherein in the embodiment as a cylinder capacitor the two carrier layers face the interior of the capacitor and in this manner each form an intermediate layer. In a further embodiment, the conductor extends between the two foils. In this embodiment, the safety cable is particularly compact and comprises a diameter that is only insignificantly greater in comparison to a conventional line. The term 'insignificantly' is understood to mean an enlargement of the diameter of approximately 1 to 10%.

The capacitance value of the capacitor is in principle also determined by the material that is arranged as a dielectric between the electrodes. This usually has a material-specific dielectric constant, in other words a relative dielectric contact $\varepsilon_r$. In a particularly preferred embodiment, this dielectric constant is dependent upon one or a multiplicity of environmental parameters, by way of example temperature or moisture, as a result of which a corresponding change of this environmental parameter may be measured with reference to a change in the resonance frequency. This is particularly of advantage if the safety cable is to be used in an environment that as a result of this environmental parameter causes a corresponding loading and possible damage to the safety cable and the line.

An insulating material is arranged between the two electrodes in a suitable variant and said insulating material has a moisture- and/or temperature-dependent dielectric constant. In the event of a corresponding temperature loading and/or in a moist environment, the dielectric constant and the resonance frequency change accordingly. As a consequence, it is possible in a particularly simple manner to establish the wear of the safety cable resulting from corresponding environmental influences. By way of example, a fire in the proximity of the safety cable is detected using a material having a temperature-dependent dielectric constant and it is consequently concluded that the line may be damaged. As an alternative or in addition thereto, the temperature loading is by way of example integrated over the time and a calculation model is used so as to correct the aging process of the line in order to ascertain therefrom a correspondingly more precise statement regarding the remaining serviceable life of the line. A particularly suitable material is by way of example polyvinylchloride, in short PVC, which has a dielectric constant that is dependent both on temperature and also on moisture.

In one suitable variant, a hygroscopic material, in particular a super-absorber, is arranged between the two electrodes and in a moist environment the hygroscopic material absorbs moisture accordingly and as a consequence experiences an increase in volume. As a consequence, the geometry of the capacitor also changes which appears in turn as a change in the resonance frequency. This also renders it possible to provide advantageously more precise statements regarding the line wear that is particularly affected by moisture. A suitable hygroscopic material is by way of example polyurethane, in short PU. Particularly suitable is alternatively a super-absorber on the chemical basis of acrylic acid and sodium acrylate. Such a super-absorber is particularly very hygroscopic and changes in volume in a suitable manner as it absorbs water. As a consequence, on the one hand the dielectric constant of the material changes and on the other hand also the spacing between the two electrodes with respect to one another changes. The effects that occur as a result of a change in the characteristic of the hygroscopic material are particularly suitable for realizing the monitoring system in this embodiment.

The insulating or hygroscopic material corresponds in a particularly space-saving embodiment in an expedient manner to the material that is used for forming an intermediate layer or a carrier layer of a foil. In other words: in lieu of introducing an additional material into the intermediate space between the electrodes, the material of the intermediate layer and/or of the carrier foil is suitably selected in an expedient manner directly, in other words a material that has a dielectric constant that is moisture- and/or temperature dependent or has a hygroscopic nature.

It is of particular advantage particularly in the case of the safety cable that the resonance frequency is in principle not dependent upon the length of the safety cable since the capacitance value changes proportional and the inductance value conversely proportional to the length. As a consequence, the safety cable is suitable in particular for production as meter goods or a semi-finished product having at least one line and a capacitor, which comprises two electrodes, and an inductor that is formed by means of a conductor extend along the line. In the case of meter goods, the conductor is in particular not yet connected to one of the electrodes; this step is only performed during the assembly procedure of the cable, in particular after cutting off a piece to a specific length. Since the capacitor and the inductor advantageously extend continuously along the line, it is possible to cut off a length of the safety cable at any desired positions and subsequently form a series resonant circuit. In order to form the series resonant circuit, one end of the conductor is connected to an end of one of the electrodes, by way of example soldered or crimped thereto.

Particularly with respect to the EMC compatibility of the monitoring system, the resonance frequency is preferably not determined during the regular operation of the safety cable, in other words by way of example during the transmission of data via the line, the reason being that this transmission is under certain circumstances negatively influenced by a test signal that is applied to the series resonant circuit. In lieu of this, the resonance frequency is determined in an expedient manner in regular or irregular intervals, by way of example during the course of an in particular re-occurring maintenance procedure. The safety cable, in particular the line, is thus not monitored continuously but rather only at specific times and by way of example at a time interval of a multiplicity of weeks, months or years.

Other features which are considered as characteristic for the invention are set forth in the appended claims.

Although the invention is illustrated and described herein as embodied in a monitoring system, a safety cable and a tube for such a system, and a method for operating a monitoring system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
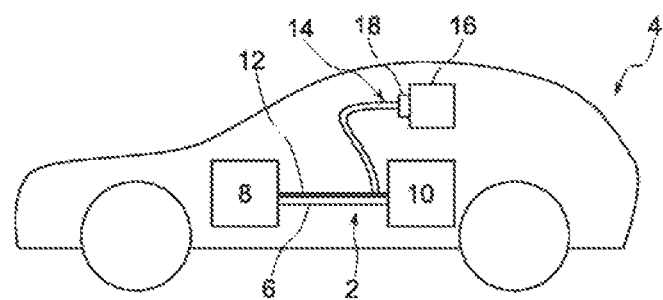
FIG. 1 is an illustration of a vehicle with a monitoring system.

Referring now to the figures of the drawings in detail and first, particularly to FIG. 1 thereof, there is shown a monitoring system 2 that is installed in a vehicle 4. The monitoring system 2 contains a safety cable 6 that in the exemplary embodiment illustrated here connects a drive assist system 8 of the vehicle 4 to a control unit 10 of the vehicle 4 for the purpose of transmitting data. The drive assist system 8 is used in particular for an autonomous driving mode of the vehicle 4; the connection that is produced by the safety cable 6 is consequently a safety-relevant connection and a possible malfunction of the safety-relevant connection is preferably forecast in order to avoid consequential damages. In order to be able to determine or ascertain the wear of the safety cable 6 and to be able to provide a prognosis regarding the remaining serviceable life of the safety cable, the monitoring system 2 contains a malfunction sensor system 12 that extends along the safety cable 6 and is connected via a connection 14 to an analysis unit 16 of the monitoring system 2. In the illustrated exemplary embodiment, the connection 14 is equipped with a plug-type connector 18 by which it is possible to connect the malfunction sensor system 12. In contrast, it is possible in an alternative, not illustrated here, for the analysis unit 16 to be a part of the monitoring system 2, in which case the connection 14 is soldered by way of example to a printed circuit board of this analysis unit 16. In a further variant, not illustrated, the analysis unit 16 is integrated into the control unit 10 of the vehicle.

Figure 2:
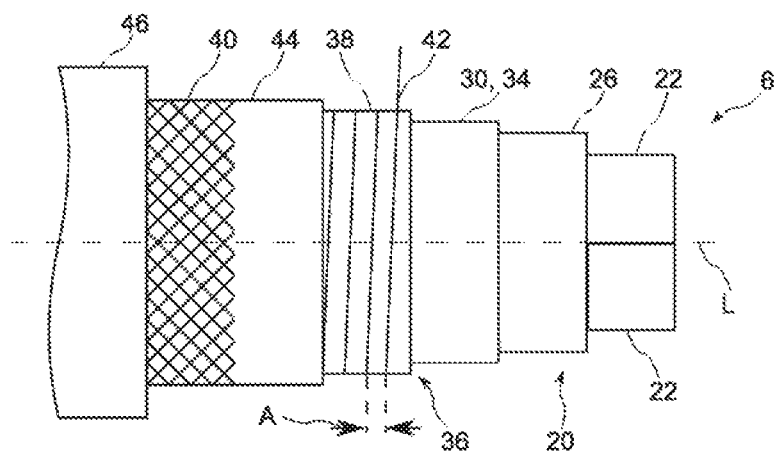
FIG. 2 is a diagrammatic, side view of a safety cable for the monitoring system according to the invention.
Figure 3:
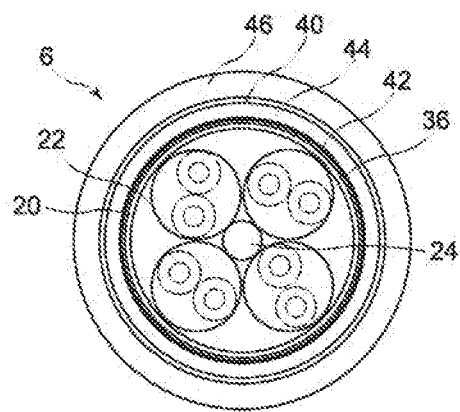
FIG. 3 is a cross-sectional view of the safety cable.

FIGS. 2 and 3 illustrate the safety cable 6 shown in FIG. 1 as meter goods in a lateral view or in a cross-sectional view. The safety cable 6 contains a centrally arranged line 20 that has a multiplicity of four core pairs 22, in this case four core pairs 22. The line 20 is consequently configured in particular as a 4-channel data line. In this respect, the line 20 represents in particular a data cable that is conventionally used. The core pairs 22 of the line 20 are grouped around a strain relief device 24 and are encased by a common line sheath 26. Further layers and/or conductive layers are arranged about the line 20 so as to form the malfunction sensor system 12.

Figure 4:
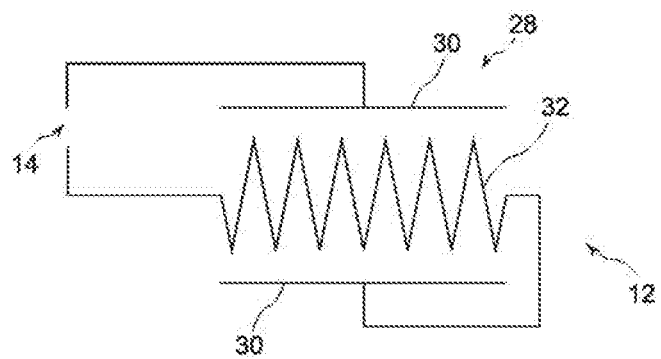
FIG. 4 is an equivalent circuit diagram of the monitoring system.

An equivalent circuit diagram of this malfunction sensor system 12 of the safety cable 6 is illustrated in FIG. 4. It is apparent in the figure that the malfunction sensor system 12 contains quite generally a capacitor 28 having two electrodes 30 and an inductor 32 that are connected in series to form a series resonant circuit. The inductor 32 in the exemplary embodiment described here is arranged within the capacitor 28. However, it is also conceivable to arrange the capacitor in an alternative position elsewhere. In order to form the series resonant circuit, the inductor 32 is electrically connected to one of the electrodes 30. The malfunction sensor system 12 contains in that case a two-pole connection 14 that may be connected to an analyzing unit 16.

The precise embodiment and arrangement of the individual elements of the malfunction sensor system 12 is further explained below with reference to FIGS. 2 and 3 in combination with the drawings of the equivalent circuit diagram shown in FIG. 4. In FIGS. 2 and 3, the capacitor 28 is arranged as a cylinder capacitor having two layers of a conductive material that are arranged in a concentric manner with respect to one another. One of the two electrodes 30 is an inner electrode 30 that is configured as a conductive layer 34 of a multi-layer foil 36. This is configured in this case as a metal-laminated foil and contains as a further layer a carrier layer 38 that is produced from an insulating material, in particular from a synthetic material and the conductive layer 34 is applied to the carrier layer. The foil 36 is oriented in the illustrated embodiment variant in such a manner that the conductive layer 34 faces inward and the carrier layer 38 faces outward. Furthermore, the conductive layer 34 is configured in a continuous manner as a result of which the multi-layer foil 36 forms a foil shield, also referred to as a b-shield, in other words the electrode 30 simultaneously forms a shielding layer for the line 20.

The outer electrode 30 is configured in the illustrated exemplary embodiment as a braid 40 that is arranged completely around the line 20 and the foil 36. The braid 40 consequently not only forms one of the electrodes 30 but rather simultaneously also forms a further shield, namely a so-called C-shield for the line 20. In one variant, not illustrated, the outer electrode 30 is also formed by way of example as part of a foil shielding arrangement, in other words part of a B-shield. Overall, an advantageous double shielding arrangement is realized by virtue of configuring the two electrodes 30 as continuous layers of conductive material and their concentric arrangement around the line 20.

A conductor 42 is wound as an inductor 32 around the line 20 between the two electrodes 30. The conductor 42 is configured as a wire and wound up in the form of a multiplicity of windings, as a result of which the inductor 32 is configured as a coil. In the illustrated exemplary embodiment, as also illustrated in FIG. 4, the inductor 32 is arranged between the electrodes 30. However, it is in general also conceivable to arrange the inductor 32 not in the intermediate space between the two electrodes 30 but rather outside the two electrodes. The windings are configured with a specific spacing A with respect to one another, as a result of which in particular a specific inductance value of the inductor 32 is adjusted. In one alternative, not illustrated, the windings are not spaced apart from one another and are in contact with one another, in other words are wound lying against one another.

In order to avoid a short circuit between the inductor 32 and the electrodes 30 along the safety cable 6, an intermediate layer 44 is arranged between the braid 40 and the wire 42, the intermediate layer being in this instance in particular a surface-extruded intermediate sheath of the safety cable 6. In order to provide galvanic isolation between the line 42 and the conductive layer 34, the multi-layer foil 36 is oriented as already mentioned above in such a manner that the carrier layer 38 faces the conductor 42 and the conductive layer 34 is oriented inwards with the result that the conductor 42 is therefore arranged on the carrier layer 38 and this forms a further intermediate layer. Furthermore, the safety cable 6 contains an outer sheath 46 that surrounds and encloses the line 20 and the malfunction sensor system 12 in particular so as to provide protection against environmental influences.

For monitoring purposes, a resonance frequency of the series resonant circuit is ascertained, the resonance frequency occurring essentially by virtue of a capacitance value of the capacitor 28 and an inductance value of the inductor 32. Depending upon the loading, the aging and wear of the safety cable, the malfunction sensor system 12 is also accordingly influenced and changes arise in the geometry and/or material characteristic that appear as changes in the inductance value and the capacitance value, in other words ultimately cause a change in the resonance frequency. The capacitance value of the capacitor 28 is determined in particular by the material that is arranged within the two electrodes 30, namely in this case the material of the intermediate layer 44 and also of the carrier layer 38. In order by means of the malfunction sensor system 12 to ascertain by way of example a loading on the safety cable 6 as a result of high temperatures or moisture, the intermediate layer 44 or the carrier layer 38 or both are produced from a material that has a temperature- and/or moisture-dependent dielectric constant. In the event of a corresponding increase in temperature or the presence of moisture in the environment of the safety cable 6, the dielectric constant of the material or materials in the intermediate space between the two electrodes 30 changes with the result that the capacitance value of the capacitor 28 changes. As a result, the resonance frequency of the series resonant circuit also changes with the result that the corresponding impairment of the safety cable 6 is established by ascertaining the resonance frequency.

FIGS. 2 and 3 illustrate the safety cable 6 initially as meter goods, in which the series resonant circuit has not been configured. In other words: the electrodes 30 and the conductor 42 are not yet connected to one another in this embodiment. In order to form the series resonant circuit and thus the malfunction sensor system 12, after the safety cable 6 has been cut to a specific length, the conductor 42 is connected at one end of the safety cable 6 to one of the electrodes 30, by way of example soldered or fixedly crimped thereto. At the other end of the safety cable 6, the connection 14 is formed by the other electrode 30 and the corresponding other end of the conductor 42, the connection in one variant being in addition connected to a plug-type connector. The monitoring system 2 is formed by this assembly procedure from the safety cable 6 as meter goods.

The following is a summary list of reference numerals and the corresponding structure used in the above description of the invention:
2 Monitoring system
4 Vehicle
6 Safety cable
8 Drive assist system
10 Control unit
12 Electronic malfunction sensor system
14 Connection
16 Analysis unit
18 Plug-type connector
20 Line
22 Core pair
24 Strain relief device
26 Line sheath
28 Capacitor
30 Electrode
32 Inductor
34 Conductive layer
36 Multi-layer foil
38 Carrier layer
40 Braid
42 Conductor
44 Intermediate layer
46 Outer sheath
A Spacing
L Longitudinal direction

The invention claimed is:

1. A monitoring system, comprising:
a safety cable containing at least one line and a malfunction sensor system extending along said at least one line, said malfunction sensor system having a capacitor with two electrodes and an inductor being formed by a conductor that is electrically connected to one of said electrodes in such a manner that a series resonant circuit is formed, said two electrodes each being configured as a shielding layer and completely enclose said at least one line.

2. The monitoring system according to claim 1, wherein said conductor is disposed between said electrodes.

3. The monitoring system according to claim 1, further comprising an analysis unit having a printed circuit board and said malfunction sensor system is connected to said printed circuit board, or that said safety cable has a plug-type connector by means of said plug-type connector it is possible to connect said malfunction sensor system to said analysis unit so as to measure a resonance frequency of the series resonant circuit.

4. The monitoring system according to claim 1, wherein said conductor is configured as a wire that is wound or spun in a multiplicity of windings around said line.

5. The monitoring system according to claim 4, wherein said windings are spaced apart from one another in a longitudinal direction with a spacing so as to adjust a specific inductance value of said inductor.

6. The monitoring system according to claim 4, wherein said conductor is an insulated wire.

7. The monitoring system according to claim 1, wherein said two electrodes are disposed in a concentric manner and form a cylinder capacitor.

8. The monitoring system according to claim 1, further comprising an intermediate layer formed of an insulating material and is disposed between said conductor and one or respectively one of said electrodes so as to galvanically isolate said conductor from said electrodes.

9. The monitoring system according to claim 1, wherein one of said electrodes is configured as a braid from a conductive material.

10. The monitoring system according to claim 1, wherein one of said electrodes is a conductive layer of a multi-layer foil that has an insulating carrier layer and said conductive layer is applied to said insulating carrier layer.

11. The monitoring system according to claim 10, wherein said insulating carrier layer faces said conductor and is disposed between said carrier layer and said conductive layer.

12. The monitoring system according to claim 1, wherein said two electrodes are each configured as a conductive layer of a multi-layer foil, each of said electrodes having a carrier layer and each said carrier layer is oriented toward said conductor and each said conductive layer faces away therefrom.

13. The monitoring system according to claim 1, further comprising an insulating material disposed between said two electrodes, said insulating material having a moisture-dependent and/or temperature-dependent dielectric constant.

14. The monitoring system according to claim 1, further comprising a hygroscopic material disposed between said two electrodes.

15. The monitoring system according to claim 1, wherein said safety cable is configured as a data cable.

16. The monitoring system according to claim 1, wherein said monitoring system is installed in an onboard electrical system of a vehicle and a drive assist system is connected to the onboard electrical system by means of said safety cable.

17. A monitoring system, comprising:
a tube; and
a malfunction sensor system extending along said tube, said malfunction sensor system having a capacitor with two electrodes and an inductor that is formed by means of a conductor that is electrically connected to one of said electrodes in such a manner that a series resonant circuit is formed, said two electrodes each being configured as a shielding layer and completely enclose said tube.

18. A tube for a monitoring system, comprising:
a capacitor extending along a length of the tube, said capacitor having two electrodes and an inductor that is formed by means of a conductor, said two electrodes each being configured as a shielding layer and completely enclose the tube.

19. A safety cable for a monitoring system, the safety cable comprising:
at least one line; and
a malfunction sensor system extending along said at least one line, said malfunction sensor system having a capacitor with two electrodes and an inductor that is formed by a conductor that is electrically connected to one of said electrodes in such a manner that a series resonant circuit is formed, said two electrodes each being configured as a shielding layer and completely enclose said at least one line.

20. The safety cable according to claim 19,
wherein the safety cable is a pre-assembled cable and in the pre-assembled cable resides said one electrode that is conductively connected to said inductor;
further comprising a plug-type connector having a two-pole connection; and
further comprising an analysis unit being disposed on a printed circuit board, wherein the pre-assembled cable having signal connections for transmitting output signals of said analysis unit.

21. A method for operating a monitoring system having a safety cable with at least one line and a malfunction sensor system extending along the at least one line, the malfunction sensor system having a capacitor with two electrodes and an inductor formed by a conductor that is electrically connected to one of the electrodes in such a manner that a series resonant circuit is formed, the two electrodes each being configured as a shielding layer and completely enclose the at least one line, which comprises the steps of:
ascertaining a resonance frequency of the malfunction sensor system;
comparing the resonance frequency with a predetermined normal frequency; and
outputting a signal if the resonance frequency deviates from the normal frequency by a predetermined minimum value.

\* \* \* \* \*